(12) United States Patent
Zolfaghari

(10) Patent No.: US 7,983,632 B2
(45) Date of Patent: Jul. 19, 2011

(54) FEEDBACK CONTROL LOOP FOR AMPLITUDE MODULATION IN A POLAR TRANSMITTER WITH A TRANSLATIONAL LOOP

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 524 days.

(21) Appl. No.: 10/966,567

(22) Filed: Oct. 15, 2004

(65) Prior Publication Data

US 2006/0068725 A1 Mar. 30, 2006

Related U.S. Application Data

(60) Provisional application No. 60/612,734, filed on Sep. 24, 2004.

(51) Int. Cl.
 *H04B 1/66* (2006.01)
(52) U.S. Cl. ........ 455/102; 455/108; 455/112; 455/126; 455/127.1; 375/300; 375/306
(58) Field of Classification Search .................. 455/102, 455/108, 110–113, 126, 127.1, 127.4; 375/298, 375/300, 306
See application file for complete search history.

(56) References Cited

U.S. PATENT DOCUMENTS

| | | | |
|---|---|---|---|
| 6,018,275 A * | 1/2000 | Perrett et al. ................. 332/127 |
| 6,101,224 A * | 8/2000 | Lindoff et al. ................ 375/300 |
| 6,215,986 B1 * | 4/2001 | Green ........................... 455/126 |
| 6,359,506 B1 * | 3/2002 | Camp et al. ............... 330/124 R |
| 6,366,177 B1 * | 4/2002 | McCune et al. ............... 332/103 |
| 6,449,465 B1 * | 9/2002 | Gailus et al. .................. 455/126 |
| 6,622,009 B1 * | 9/2003 | Tolson ............................ 455/76 |
| 6,633,199 B2 * | 10/2003 | Nielsen et al. ................ 330/129 |
| 6,653,909 B2 * | 11/2003 | Nielsen ......................... 332/151 |
| 6,701,134 B1 * | 3/2004 | Epperson ...................... 455/102 |
| 6,750,719 B2 * | 6/2004 | Toyota et al. ................. 330/285 |
| 6,775,330 B2 * | 8/2004 | Bach et al. .................... 375/296 |
| 6,834,084 B2 * | 12/2004 | Hietala ......................... 375/296 |
| 6,844,788 B2 * | 1/2005 | Chadwick ..................... 332/159 |
| 6,917,791 B2 * | 7/2005 | Chadwick ..................... 455/126 |
| 6,983,024 B2 * | 1/2006 | Ballantyne .................... 375/261 |
| 7,010,276 B2 * | 3/2006 | Sander et al. ................. 455/108 |
| 7,072,626 B2 * | 7/2006 | Hadjichristos ................ 455/126 |
| 7,082,290 B2 * | 7/2006 | Takano et al. ................. 455/102 |
| 7,132,900 B2 * | 11/2006 | Yahagi et al. ............. 331/108 C |
| 7,301,404 B2 * | 11/2007 | Mattisson ........................ 331/2 |
| 7,333,780 B2 * | 2/2008 | Udagawa et al. ............. 455/126 |
| 7,383,028 B2 * | 6/2008 | Suzuki et al. ................. 455/126 |

(Continued)

OTHER PUBLICATIONS

Steven C. Cripps, *RF Power Amplifiers for Wireless Communications*, 1999, pp. Library of Congress page, v, 258-261, 281, Artech House, Norwood, Massachusetts.

(Continued)

*Primary Examiner* — Edward Urban
*Assistant Examiner* — RuiMeng Hu
(74) *Attorney, Agent, or Firm* — McAndrews, Held & Malloy, Ltd.

(57) ABSTRACT

Amplitude modulation is provided for a polar transmitter that incorporates a translational loop. The input to the polar transmitter and translational loop may be an amplitude modulated signal. The amplitude modulation of the transmitter may be controlled via a closed loop to help ensure that the output of the amplifier accurately corresponds to the modulated input signal. The transmitter may incorporate partially integrated or separate translational and amplitude modulation loops.

66 Claims, 8 Drawing Sheets

U.S. PATENT DOCUMENTS

| | | | |
|---|---|---|---|
| 2002/0090921 A1* | 7/2002 | Midtgaard et al. | 455/126 |
| 2002/0186440 A1* | 12/2002 | Adachi et al. | 359/181 |
| 2002/0196864 A1* | 12/2002 | Booth et al. | 375/296 |
| 2003/0067994 A1* | 4/2003 | Chadwick | 375/295 |
| 2003/0141932 A1* | 7/2003 | Toyota et al. | 330/285 |
| 2003/0199259 A1* | 10/2003 | Macedo et al. | 455/141 |
| 2003/0203720 A1* | 10/2003 | Oosawa et al. | 455/84 |
| 2003/0224743 A1* | 12/2003 | Okada et al. | 455/127.2 |
| 2003/0227342 A1* | 12/2003 | Liu | 332/145 |
| 2004/0046607 A1* | 3/2004 | Grange | 330/10 |
| 2004/0108896 A1* | 6/2004 | Midtgaard | 330/136 |
| 2004/0184559 A1* | 9/2004 | Ballantyne | 375/300 |
| 2004/0185809 A1* | 9/2004 | Jenkins | 455/127.2 |
| 2004/0198257 A1* | 10/2004 | Takano et al. | 455/108 |
| 2004/0203553 A1* | 10/2004 | Toyota et al. | 455/333 |
| 2004/0208157 A1* | 10/2004 | Sander et al. | 370/345 |
| 2004/0212445 A1* | 10/2004 | Haglan | 332/103 |
| 2004/0219891 A1* | 11/2004 | Hadjichristos | 455/102 |
| 2004/0219893 A1* | 11/2004 | Takano et al. | 455/114.3 |
| 2004/0229592 A1* | 11/2004 | Matsui et al. | 455/333 |
| 2004/0248528 A1* | 12/2004 | Rozenblit et al. | 455/126 |
| 2004/0266366 A1* | 12/2004 | Robinson et al. | 455/91 |
| 2005/0024138 A1* | 2/2005 | White et al. | 330/149 |
| 2005/0040896 A1* | 2/2005 | Yahagi et al. | 331/25 |
| 2005/0059372 A1* | 3/2005 | Arayashiki et al. | 455/252.1 |
| 2005/0064828 A1* | 3/2005 | Kurakami et al. | 455/115.1 |
| 2005/0074073 A1* | 4/2005 | Yuan et al. | 375/268 |
| 2005/0110568 A1* | 5/2005 | Robinson et al. | 330/151 |
| 2005/0124303 A1* | 6/2005 | Bengtson et al. | 455/91 |
| 2005/0130609 A1* | 6/2005 | Nagode et al. | 455/126 |
| 2005/0176388 A1* | 8/2005 | Yamawaki et al. | 455/126 |
| 2005/0233714 A1* | 10/2005 | Kajiwara et al. | 455/127.3 |
| 2005/0239422 A1* | 10/2005 | Jafari et al. | 455/126 |
| 2006/0003712 A1* | 1/2006 | Schell | 455/115.1 |
| 2006/0008029 A1* | 1/2006 | Jafari et al. | 375/297 |
| 2006/0046666 A1* | 3/2006 | Hara et al. | 455/127.1 |
| 2006/0057976 A1* | 3/2006 | Klemmer | 455/102 |
| 2006/0062325 A1* | 3/2006 | Jensen | 375/297 |
| 2006/0063496 A1* | 3/2006 | Sander et al. | 455/108 |
| 2006/0114068 A1* | 6/2006 | Midtgaard et al. | 331/16 |
| 2006/0246856 A1* | 11/2006 | Udagawa et al. | 455/108 |

OTHER PUBLICATIONS

M. Elliott, et al., "A Polar Modulator Transmitter for EDGE," *2004 IEEE International Solid-State Circuits Conference, Session 10, Cellular Systems and Building Blocks*, 2004, pp. 146-147, 496, 190-191, 522, 10.5, IEEE.

Tirdad Sowlati, et al., "Quad-Band GSM/GPRS/EDGE Polar Loop Transmitter," *2004 IEEE International Solid-State Circuits Conference, Session 10, Cellular Systems and Building Blocks*, 2004, pp. 142-143, 493-494, 186-187, 521, 10.3, IEEE.

* cited by examiner

US 7,983,632 B2

FEEDBACK CONTROL LOOP FOR AMPLITUDE MODULATION IN A POLAR TRANSMITTER WITH A TRANSLATIONAL LOOP

CROSS-REFERENCE TO RELATED APPLICATION(S)

This application claims the benefit of U.S. Provisional Patent Application No. 60/612,734, filed Sep. 24, 2004, the disclosure of which is hereby incorporated by reference herein.

TECHNICAL FIELD

This application relates to data communications and, more specifically, to an amplitude modulation scheme for a polar transmitter that incorporates a translational loop.

BACKGROUND

In a typical data communication system data is sent from a transmitter to a receiver over a communication media such as a wire, a fiber optic cable or air. In some applications, data is transmitted over the media via a modulated radio frequency ("RF") signal. For example, in a wireless communication system a transmitter may use a relatively low frequency (e.g., less than 1 MHz) data signal to modulate a relatively high frequency carrier signal (e.g., 1 GHz). The receiver will then demodulate the received modulated carrier signal to extract the original data signal.

Typical forms of modulation used in wireless communication include phase modulation and amplitude modulation. Here, phase modulation may involve adjusting the phase of the carrier signal according to the information in the data signal. In contrast, amplitude modulation may involve adjusting the amplitude of the carrier signal according to the information in the data signal. Conventionally, the amplitude waveform of a modulated signal is referred to as the "envelope" of the signal.

In some applications it may be desirable to use a form of modulation that does not modulate the envelope of the carrier signal. For example, when constant envelope modulation is employed in an RF system, the system may use a nonlinear power amplifier instead of a linear power amplifier. This may provide, as a result, a more cost effective and/or efficient system.

An example of a constant envelope system is defined by the Global System for Mobile communications/General Packet Radio Service ("GSM/GPRS") standard for wireless communication devices. This standard incorporates Gaussian Minimum Shift Keying ("GMSK") modulation.

In general, a constant envelope modulation signal may be represented as:

$$s(t)=A\cos[\omega_c t+\Phi(t)] \quad \text{EQUATION 1}$$

where $\Phi(t)$ contains the information of the signal.

Since the envelope of the signal is constant, the transmitter architecture is not limited to a Cartesian topology. As a result, other architectures have been proposed for constant envelope systems.

For example, FIG. 1 illustrates a transmitter 100 implemented using a translational loop (also know as an offset PLL) architecture. A modulator 102 modulates an input signal (e.g., I/Q signals 104) and outputs a modulated signal 106 to a limiter 108. The limiter 108 serves to remove any amplitude information present in the signal 106. Thus, the signal 110 output by the limiter 108 may, for example, only include phase information.

A phase lock loop circuit modulates an output signal 112 according to the signal 110. The phase lock loop circuit includes a phase/frequency detector and charge pump 114, a low pass filter 116, a voltage controlled oscillator ("VCO") 118 and a feedback loop. The feedback loop includes a mixer 120 and a low pass filter 124 for downconverting the output signal 112 using to a local oscillator ("LO") signal 122.

Although a constant envelope architecture may enable the use of more efficient components such as nonlinear power amplifiers and may be used effectively in circuits such as a translational loop, this architecture may not efficiently use the available bandwidth of the communication media. To facilitate efficient transmission of data over the media, more than one form of modulation may be used to modulate a signal. For example the EDGE standard incorporates both phase and amplitude modulation. As a result, the EDGE standard may support data rates three times higher than GSM/GPRS while using the same bandwidth. In this case, the modulated signal may be represented as:

$$s(t)=A(t)\cos[\omega_c t+\Phi(t)] \quad \text{EQUATION 2}$$

To obtain the benefits of using a nonlinear power amplifier and a translational loop, the architecture of FIG. 1 may be modified to a polar transmitter architecture as shown in FIG. 2. In this case, a modulator 202 provides an input signal 204 that may be phase and amplitude modulated. The phase and envelope information may then be separated in the baseband.

For example, a limiter 206 may provide the phase information (cos $[\omega_c t+\Phi(t)]$) to a constant amplitude transmitter such as the translational loop portion of the transmitter 200 of FIG. 2. As in FIG. 1, the transmitter 200 may include translational loop components such as a phase/frequency detector and charge pump 208, a low pass filter 210, a VCO 212, a mixer 214 and a low pass filter 216 that outputs a phase modulated signal 222.

An envelope detector 220 may detect the envelope (e.g., amplitude modulation) of the modulated input signal 204. The envelope of the signal (A(t)) is used to amplitude modulate the signal 222 by controlling the gain of the power amplifier 218. Thus, the power amplifier 218 outputs a phase and amplitude modulated signal 224.

Although this architecture may provide benefits as discussed above, the performance of a transmitter implementing this architecture may not be optimum due to limitations in the system. Accordingly, a need exists for an improved transmitter for transmitting modulated signals.

SUMMARY

The invention relates to a system and method for providing amplitude modulation in a polar transmitter that incorporates a translational loop. For convenience, an embodiment of a system constructed or a method practiced according to the invention will be referred to herein simply as an "embodiment."

In one aspect of the invention, the input to the polar transmitter and translational loop is an amplitude modulated signal. In other words, the input signal is amplitude modulated outside of the translational loop.

In one aspect of the invention, the amplitude modulation of the transmitter is controlled via a closed loop. For example, in some embodiments the modulated input signal may be provided to a control loop to generate a control signal that controls the gain of a variable gain amplifier. In this way, the envelope of the signal output by the amplifier may be modulated according to the modulation signal. In addition, the output of the amplifier is fed back to the control loop to help ensure that the output of the amplifier accurately corresponds to the modulated input signal.

In some embodiments the modulated input signal may be provided to a control loop to generate a control signal that is mixed with a phase modulated signal. In this way, the envelope of the signal output by the mixer may be modulated according to the modulation signal. In addition, the output of the mixer is fed back to the control loop to help ensure that the output of the mixer accurately corresponds to the modulated input signal.

In some embodiments the transmitter includes a translational loop and an amplitude modulation loop that share down conversion components. For example, the output of a mixer or a variable gain power amplifier in the transmitter may be fed back to a local oscillator and low pass filter to downconvert the modulated carrier signal back to a baseband signal. The output of the low pass filter may then be fed to separate translational loop and amplitude modulation loop paths.

In some embodiments the transmitter incorporates separate translational and amplitude modulation feedback loops. For example, the output of a VCO in the transmitter may be fed back to the translation loop and the output of the mixer or adjustable gain power amplifier may be fed back to the amplitude modulation loop.

BRIEF DESCRIPTION OF THE DRAWINGS

These and other features, aspects and advantages of the present invention will be more fully understood when considered with respect to the following detailed description, appended claims and accompanying drawings, wherein:

Figure 1:
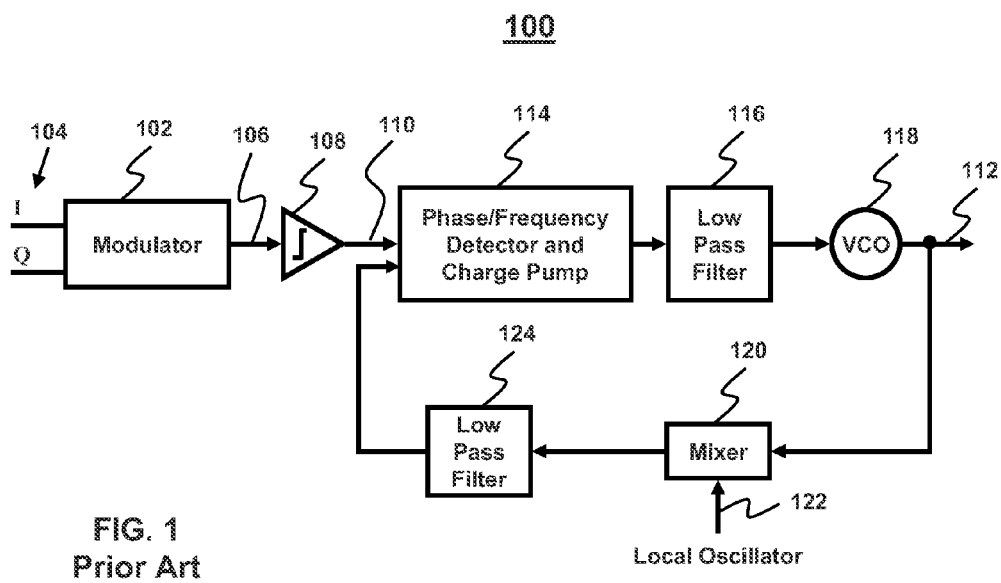
FIG. 1 is a simplified block diagram of one embodiment of a translational loop transmitter.
Figure 2:
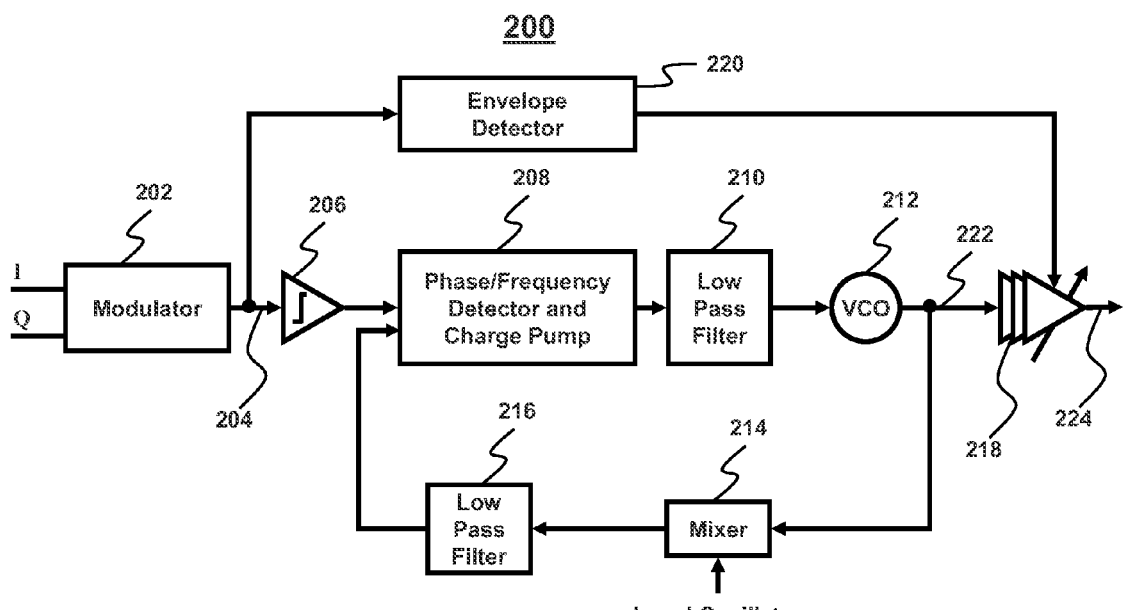
FIG. 2 is a simplified block diagram of one embodiment of a polar transmitter employing a translational loop.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals denote like features throughout the specification and figures.

DETAILED DESCRIPTION

The invention is described below, with reference to detailed illustrative embodiments. It will be apparent that the invention may be embodied in a wide variety of forms, some of which may be quite different from those of the disclosed embodiments. Consequently, the specific structural and functional details disclosed herein are merely representative and do not limit the scope of the invention.

Figure 3:
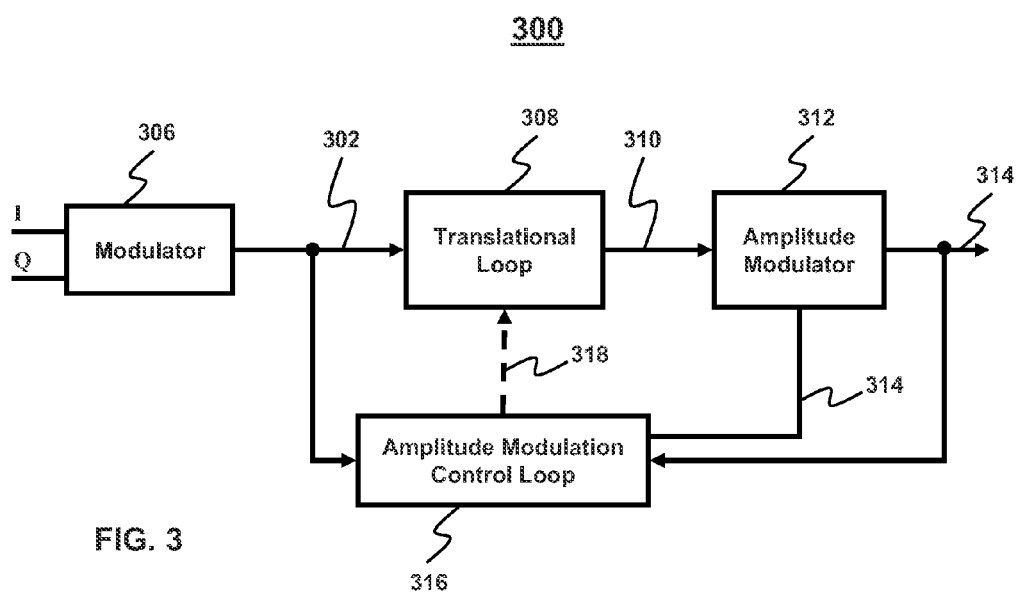
FIG. 3 is a simplified block diagram of one embodiment of a polar transmitter including a translational loop constructed in accordance with the invention.

FIG. 3 is a simplified block diagram of one embodiment of a transmitter 300 constructed in accordance with the invention. The transmitter 300 upconverts a modulated input signal 302 to generate a modulated output signal 304. The operation of the transmitter 300 will be explained in more detail in conjunction with the flowchart of FIG. 4.

Figure 4:
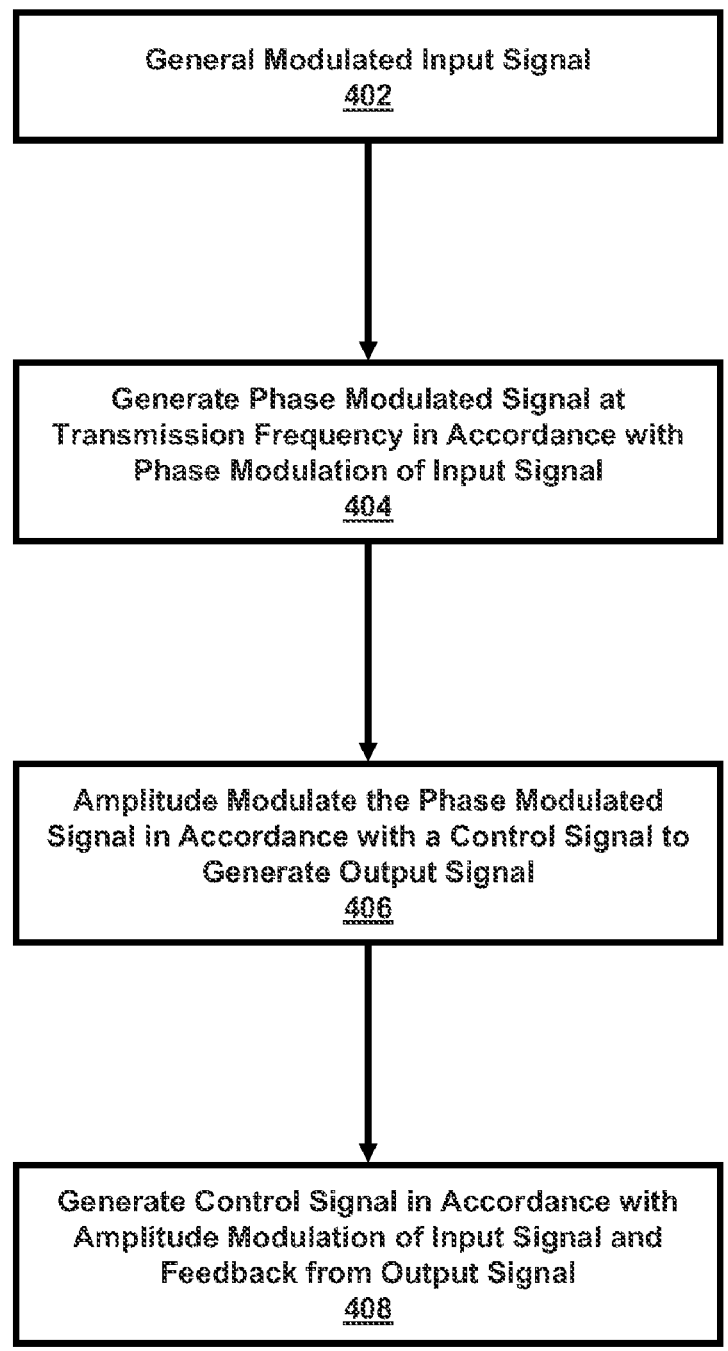
FIG. 4 is a flow chart of one embodiment of operations that may be performed by the transmitter of FIG. 3 in accordance with the invention.

As represented by block 402 in FIG. 4, a modulator 306 (FIG. 3) generates the modulated input signal 302. In some embodiments the modulated input signal 302 is modulated in amplitude and phase.

As represented by block 404, a translational loop 308 generates a phase modulated signal 310 that may be efficiently transmitted through a transmission medium. In a typical wireless transmitter, this involves upconverting the input signal 302 to a higher frequency. The translational loop attempts to ensure, however, that the phase modulated signal 310 includes the same phase information as the input signal 302. The phase modulated signal 310 may not, however, include amplitude modulation.

As represented by block 406, an amplitude modulator 312 may use a control signal 314 to impart amplitude modulation on the phase modulated signal 310. The amplitude modulator 312 may comprise, for example, a mixer or a variable gain amplifier.

In embodiments that incorporate a variable gain amplifier 312, the amplifier 312 amplifies the phase modulated signal 310 to generate the output signal 304. In some embodiments amplitude modulation is imparted on the phase modulated signal 310 by adjusting the gain of the amplifier 312. Thus, the output signal 304 may be modulated in amplitude and phase in the same manner as the input signal 302. The gain of the amplifier 312 is controlled by a gain control signal 314.

In embodiments that incorporate a mixer 312, the mixer 312 mixes the phase modulated signal 310 with a control signal 314 to generate the output signal 304. In some embodiments the mixer is implemented using a Gilbert cell structure. For example, the high frequency VCO signal (e.g., signal 310) may be provided to commutating switches of the mixer and the control signal (e.g., signal 314) may be provided to transconductor devices of the mixer. It should be appreciated that other types of mixers may be used in accordance with the teachings herein.

In some embodiments the mixer may be tuned to the RF frequency of the output signal. In this case, harmonics related to the mixing operation may be substantially attenuated. As a result, the output signal 304 may need to be filtered or less filtering may be needed for the output signal 304 as compared to other mixing techniques.

As represented by block 408, an amplitude modulation control loop 316 generates the gain control signal 314 in accordance with the amplitude modulation of the input signal 302. In addition, through feedback of the output signal 304, the amplitude modulation control loop 316 may ensure that the amplitude modulation of the output signal 304 accurately corresponds to the amplitude modulation of the input signal 302.

As represented by the dashed line 318, in some embodiments information fed back from the output signal 310 is used by the translational loop to adjust the phase of the phase modulated signal 310. For example, the phase information from the output signal may be compared with the phase information from the input signal 302. Alternatively, the translational loop may adjust the phase of the phase modulated signal 310 by comparing the phase information of the phase modulated signal 310 with the phase information from the input signal 302.

Figure 5:
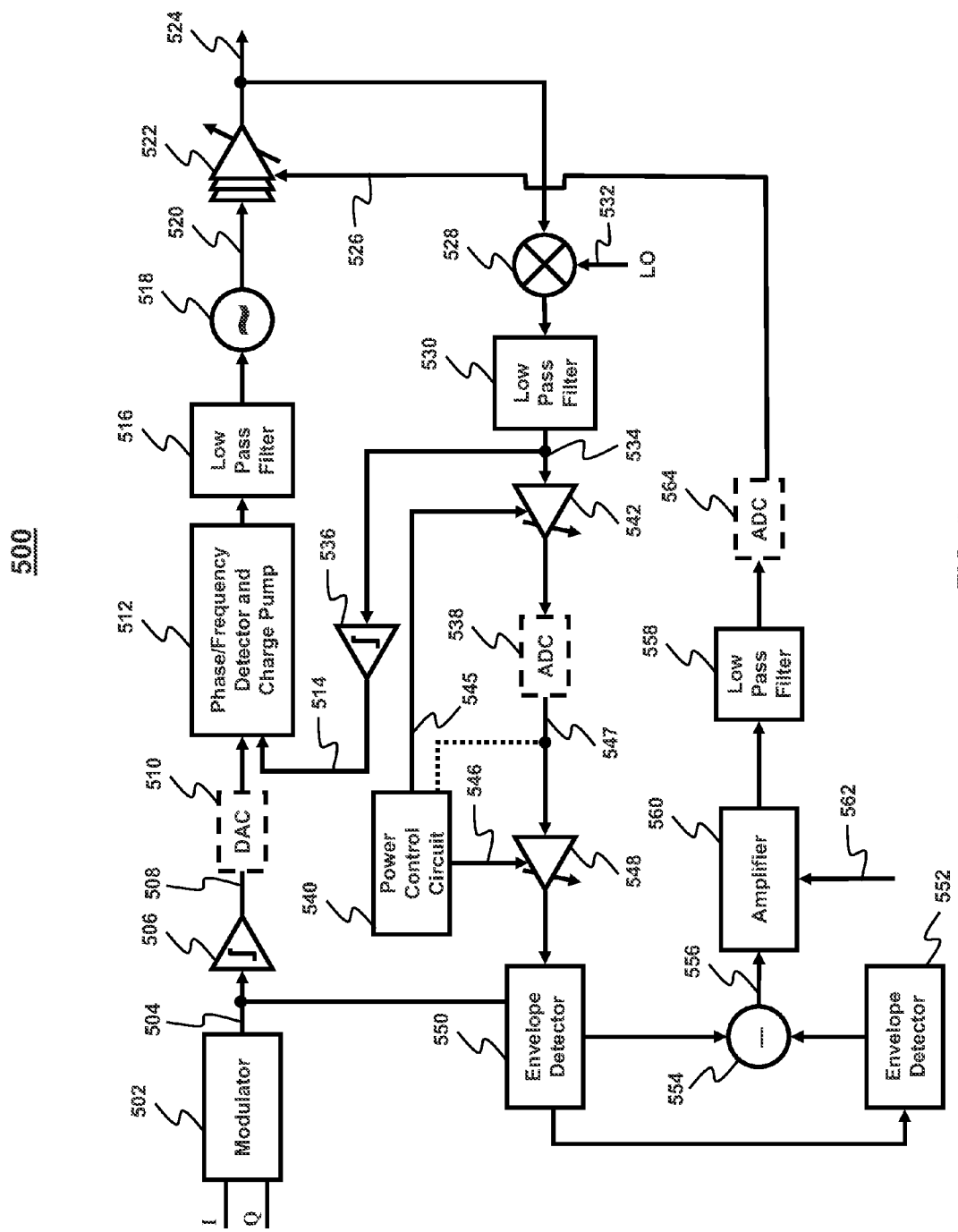
FIG. 5 is a simplified block diagram of one embodiment of a polar transmitter including a translational loop constructed in accordance with the invention.
Figure 6:
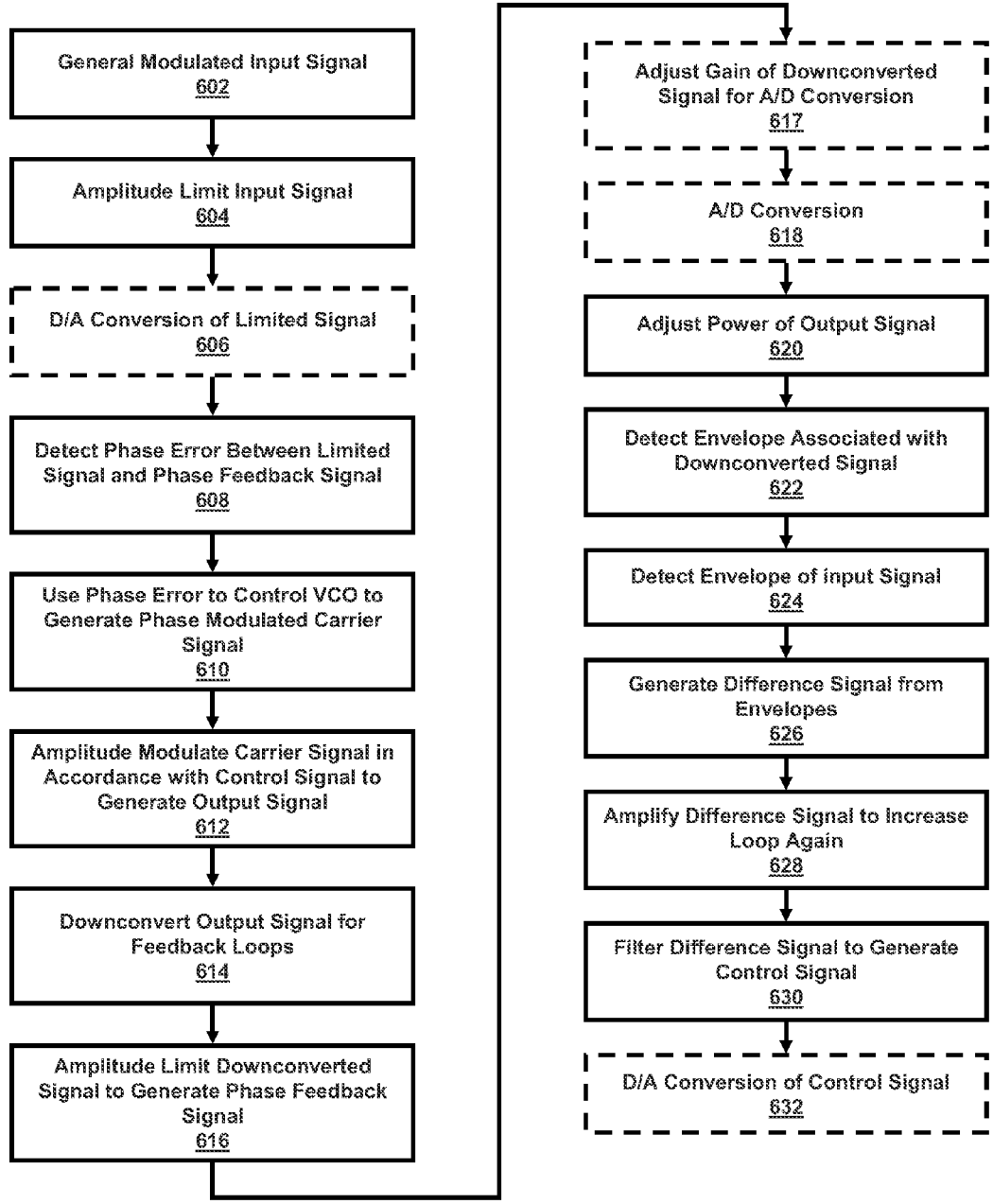
FIG. 6 is a flow chart of one embodiment of operations that may be performed by the transmitter of FIG. 5 in accordance with the invention.

Referring now to FIGS. 5 and 6, additional details of a transmitter will be described. FIG. 5 is a simplified block diagram of one embodiment of a transmitter 500. FIG. 6 is a flow chart illustrating several operations that may be performed by the transmitter 500.

As represented by block 602 in FIG. 6, a modulator 502 (FIG. 5) generates a modulated input signal 504. The input signal 504 includes both amplitude modulation and phase modulation. In some embodiments the input signal 504 may be an intermediate frequency ("IF") signal. For example, the input signal may have an IF frequency on the order of 20-30 MHz. Alternatively, the input signal 504 may be a baseband signal.

As represented by block 604 an amplitude limiter 506 limits the amplitude of the input signal 504. As a result, the translational loop components that follow will operate on a constant envelope, limited signal 508. Typically, the limiter 506 is constructed using a comparator that triggers on the zero crossing of the input signal.

The components and blocks represented by dashed lines in FIGS. 5 and 6 relate to components that may optionally be used in some embodiments. For example, some of these components may be used in embodiments that perform digital signal processing such that several of the blocks in FIG. 5 represent operations performed in the digital domain. In this case, a digital signal processor or some other form of processor or hardware circuitry may provide the described functions. Similarly, the corresponding processes described in FIG. 6 may be implemented in the digital domain. For convenience, signals that have been converted from analog to digital or vice versa may be referred to herein using the same name.

As represented by block 606, when the input signal processing is performed in the digital domain, a digital to analog ("D/A") converter ("DAC") 510 may convert the limited signal to analog form. It should also be appreciated that the D/A converter 510 does not necessarily need to follow the limiter. Thus, the D/A converter 510 may be located at another location in the input signal path.

As represented by block 608, a phase/frequency detector and charge pump circuit 512 detects phase error between the limited signal 508 and a phase error feedback signal 514. The output of the phase/frequency detector and charge pump circuit 512 is provided to a low pass filter 516. In an alternative embodiment, an integrator and low pass filter combination (not shown) may detect the phase error.

As represented by block 610, the filtered phase error information controls a voltage controlled oscillator ("VCO") 518. The VCO 518 generates a carrier signal 520 that includes phase modulation in accordance with the phase modulation of the input signal 504. At this point, the carrier signal 520 does not include amplitude modulation.

In a typical receiver, the carrier signal will have a much higher frequency than the IF frequency. For example, for a GSM application, the carrier frequency may be on the order of 800-900 MHz. For Personal Communications Service ("PCS") or Digital Cellular Service ("DCS") wireless systems the carrier frequency may be on the order of 1.8-1.9 GHz. It should be appreciated that the teachings of the invention are not limited to these data rates or communications standards but are, instead, applicable to a variety of communication system architectures, standards and implementations.

As represented by block 612, a variable gain amplifier 522 amplifies the carrier signal 520 to generate an output signal 524. By adjusting the gain of the amplifier 522, the carrier signal 520 may be amplitude modulated. Thus, the output signal 524 may be modulated in amplitude and phase in the same manner as the input signal 504.

In some embodiments, the amplifier 522 may be a power amplifier. In this case, the power amplifier may be a nonlinear amplifier.

In some embodiments a separate power amplifier (not shown) may be used to amplify the output signal 524. In this case, the power amplifier would typically be a linear amplifier.

A power amplifier may or may not be located on the same integrated circuit as other components of the described transmitter 500. Typically, if the power amplifier is located on a different integrated circuit, a coupler circuit (not shown) may be used to couple the output of the power amplifier to the feedback loops. In contrast, when the power amplifier is located on the same integrated circuit, a direct connection may couple the output of the power amplifier to the feedback loops.

As discussed above in conjunction with FIG. 3, a mixer (not shown in FIG. 5) may be employed instead of a variable gain amplifier. For example, signals 520 and 526 may be mixed to provide the output signal 524. The output (e.g., output 524) of the mixer may then be provided to a power amplifier (not shown).

A control signal provides the amplitude information for the variable gain amplifier or the mixer. That is, the gain of the amplifier 522 may be controlled by a gain control signal 526. Alternatively, a control signal 526 may be used to control the amplitude of the output of the mixer.

The magnitude of the control signal 526 is controlled, in turn, by a closed loop feedback circuit. As represented by block 614, the output signal 524 is initially downconverted by a mixer 528 and a low pass filter 530. The mixer 528 mixes the output signal 524 with a signal 532 from a local oscillator. In this way, the output signal may be presented to the feedback loops at the same base frequency (e.g., IF or baseband) as the input signal 504.

In the embodiment of FIG. 5, a downconverted signal 534 output by the low pass filter 530 is limited by an amplitude limiter 536 (block 616). The limited output of the limiter 536 provides the phase feedback signal 514.

In the embodiment of FIG. 5, the downconverted signal 534 also is used by an amplitude modulation control loop. As represented by blocks 617 and 618, in some embodiments the downconverted signal 534 may optionally be amplified by an amplifier 542 and converted to a digital signal by an analog-to-digital ("A/D") converter ("ADC") 538. In this case, subsequent processing may be performed in the digital domain.

It should be appreciated that the A/D converter 538 does not necessarily need to follow the low pass filter 530. Thus, the A/D converter 538 (and optionally the amplifier 542) may be located at another location in the amplitude modulation control loop. For example, the A/D converter 538 may be located after a gain controller 548 discussed below.

As represented by block 617, in some embodiments the amplifier 542 may be used to improve the dynamic range of the A/D converter 538. For example, the gain of the amplifier 542 may be adjusted to maintain the amplitude of the input signal for the A/D converter 538 within a given range. Here, a power control circuit 540 may generate a control signal 545 that controls the gain of the amplifier 542.

In some embodiments the control circuit 540 monitors an output signal 547 (as represented by the optional dashed line) from the A/D converter 538 to adjust the control signal 545. For example, the control circuit 540 may adjust the gain of the amplifier 542 when the maximum amplitude of the signal 547 is too high or too low.

Alternatively, the control circuit 540 may adjust the gain of the amplifier 542 based on known circuit parameters. For example, the control circuit 540 will be able to approximate the magnitude of the output power based on the control circuit's control of the amplifiers 542 and/or 548. In addition, the gains of the mixer 528 and low pass filter 530 may be known quantities. As a result, an estimate of the magnitude of the signal 534 may be made. Accordingly, the control circuit 540 may control the gain of the amplifier 542 to adjust the amplitude of the input signal for the A/D converter 538 to be within a desired range.

As represented by block 620, one or more gain controllers (e.g., a variable amplifier/attenuator such as amplifier 542 and/or amplifier 548) may be used to adjust the power of the output signal 524. For example, the power control circuit 540 may control the signal 545 to adjust the gain of the amplifier 542. Similarly, the power control circuit 540 may generate a control signal 546 that controls the gain of the amplifier 548. One or both of these gain controllers may then adjust the amplitude of the downconverted output signal. In some embodiments, the power control circuit 540 may be provided by baseband circuits and/or operations of the transmitter.

The envelopes (e.g., the amplitude modulation) of the downconverted (and, in some embodiments gain adjusted) output signal and the input signal 504 may be compared to determine how accurately the amplifier 522 is amplitude modulating the carrier signal 520 in relation to the amplitude modulation of the input signal 504. An envelope detector 550 detects the envelope of the downconverted (an optionally amplitude adjusted) signal (block 622). An envelope detector 552 detects the envelope of the input signal 504 (block 624).

Next, as represented by block 626, the detected envelopes are compared to determine whether there is any difference between the envelopes. In the embodiment shown in FIG. 5 an adder 554 is used to subtract one detected envelope (e.g., from detector 550) from the other detected envelope (e.g., from detector 552) to generate a difference/error signal 556. It should be appreciated that other circuits may be used to obtain the difference/error signal 556. For example, a variety of arithmetic logic or comparator circuits may be provided for this purpose.

As represented by block 628, in some embodiments a gain stage is provided in the amplitude modulation feedback loop to increase the loop gain. For example, an amplifier 560 may be used to amplify the difference/error signal 556 in accordance with a control signal 562. In general, to have a relatively small error between the baseband and feedback envelopes, the loop gain should be relatively high. It should be appreciated that one or more amplifiers may be provided in other parts of the circuit to increase the loop gain. For example, an amplifier may be optionally (or also) provided after the low pass filter 558.

In some embodiments a gain control signal from the baseband (not shown) may be used to adjust the gain of the amplifier 522. Here, the gain of the amplifier 522 may be adjusted, for example, to account for interference in the vicinity of the transmitter or for other purposes which are known in the art. In some embodiments, gain may be adjusted using an adder circuit (not shown) instead of the amplifier 560.

The amplified difference/error signal may be filtered by a low pass filter 558 to, for example, eliminate spurious noise and/or other undesirable frequencies from the signal (block 630). In a typical implementation such as EDGE, the bandwidth of the low pass filter 558 may be on the order of 2-3 MHz. The resulting signal output by the low pass filter 558 may be used as the control signal 526.

In embodiments where prior processing was performed in the digital domain, the control signal 526 may be converted to an analog signal by a digital-to-analog converter 564 (block 632). It should be appreciated that the D/A converter 564 may be located at another location in the amplitude modulation control loop.

From the above it may be seen that through feedback of the output signal 524, the amplitude modulation control loop may ensure that the amplitude modulation of the output signal 524 accurately corresponds to the amplitude modulation of the input signal 504.

Figure 7:
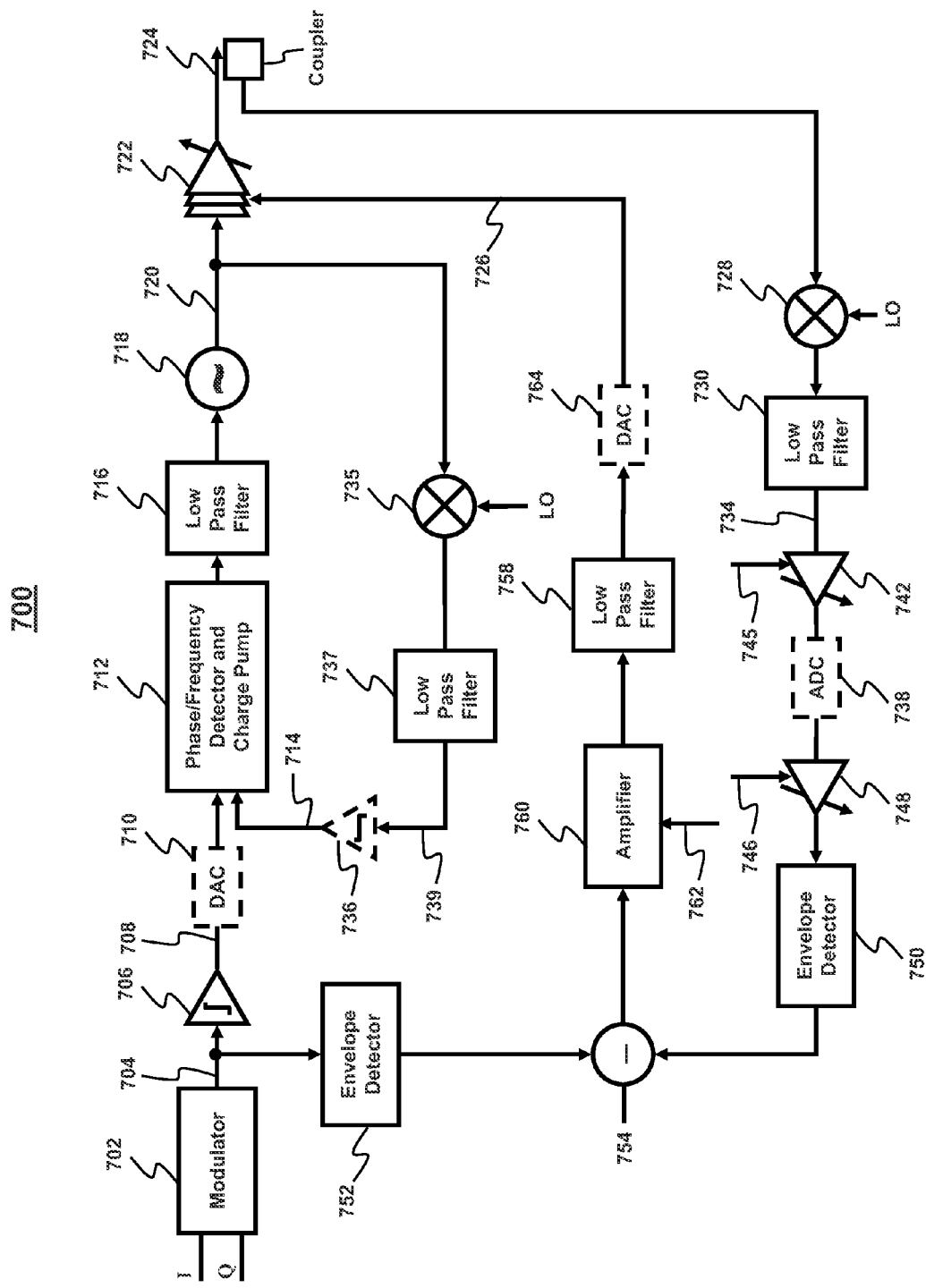
FIG. 7 is a simplified block diagram of one embodiment of a polar transmitter including a translational loop constructed in accordance with the invention.
Figure 8:
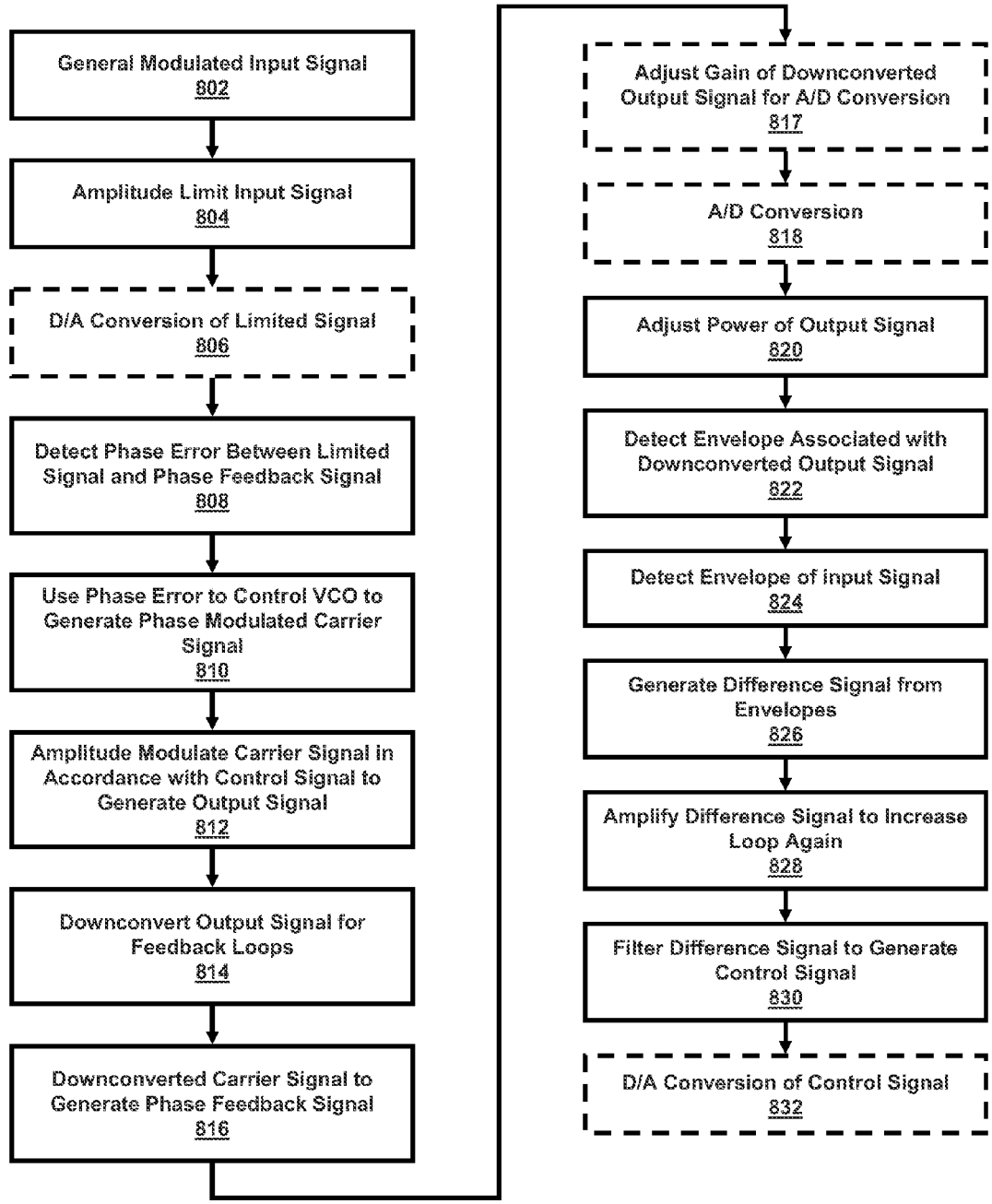
FIG. 8 is a flow chart of one embodiment of operations that may be performed by the transmitter of FIG. 7 in accordance with the invention.

Referring now to FIGS. 7 and 8, an alternative transmitter architecture will be discussed. FIG. 7 is a simplified block diagram of one embodiment of a transmitter 700. FIG. 8 is a flow chart illustrating several operations that may be performed by the transmitter 700.

In general, the components and operations depicted in FIGS. 7 and 8 are similar to corresponding components and operations depicted in FIGS. 5 and 6 with similar reference designations (e.g., reference designations 522 and 722). Thus, for convenience, only several significant distinctions between the two sets of figures will be discussed.

Moreover, for convenience not all of the components shown in FIG. 5 are shown in FIG. 7. It should be appreciated however, that some or all of the components and operations described in conjunction with FIGS. 5 and 6 may be incorporated into the embodiment of FIGS. 7 and 8.

In the embodiment of FIG. 7 separate feedback loops are provided for the translational loop and the amplitude modulation control loop. For example, as represented by block 814 a mixer 728 and associated low pass filter 730 downconvert the output signal 724 using a local oscillator signal LO. A resulting downconverted signal 734 is then processed within an amplitude modulation control loop to generate a control signal as discussed above.

In contrast with the architecture of FIG. 5, the feedback signal for the translational loop In FIG. 7 originates from the phase modulated signal 720, not the phase and amplitude modulated output signal 724. Since the signal 720 is not amplitude modulated, a limiter 736 may not be needed in the translational loop feedback path. Thus, as represented by block 816 in FIG. 8, a separate mixer 735 and associated low pass filter 737 are provided for downconverting the signal 720 using a local oscillator signal LO. In some embodiments the output 739 of the low pass filter 737 constitutes the phase feedback signal 714.

In alternate embodiments a limiter 736 may be used to amplitude limit the signal 739 to generate the phase feedback signal 714. The limiter 736 may be used, for example, in applications where some amplitude modulation may be present in the signal 739 due to the characteristic of the preceding components.

In some applications, the embodiment of FIGS. 7 and 8 may provide improved performance since the loops are independent. For example, the feedback signal for the translational loop does not pass through a limiter which otherwise may affect the phase information in the signal.

Figure 9:
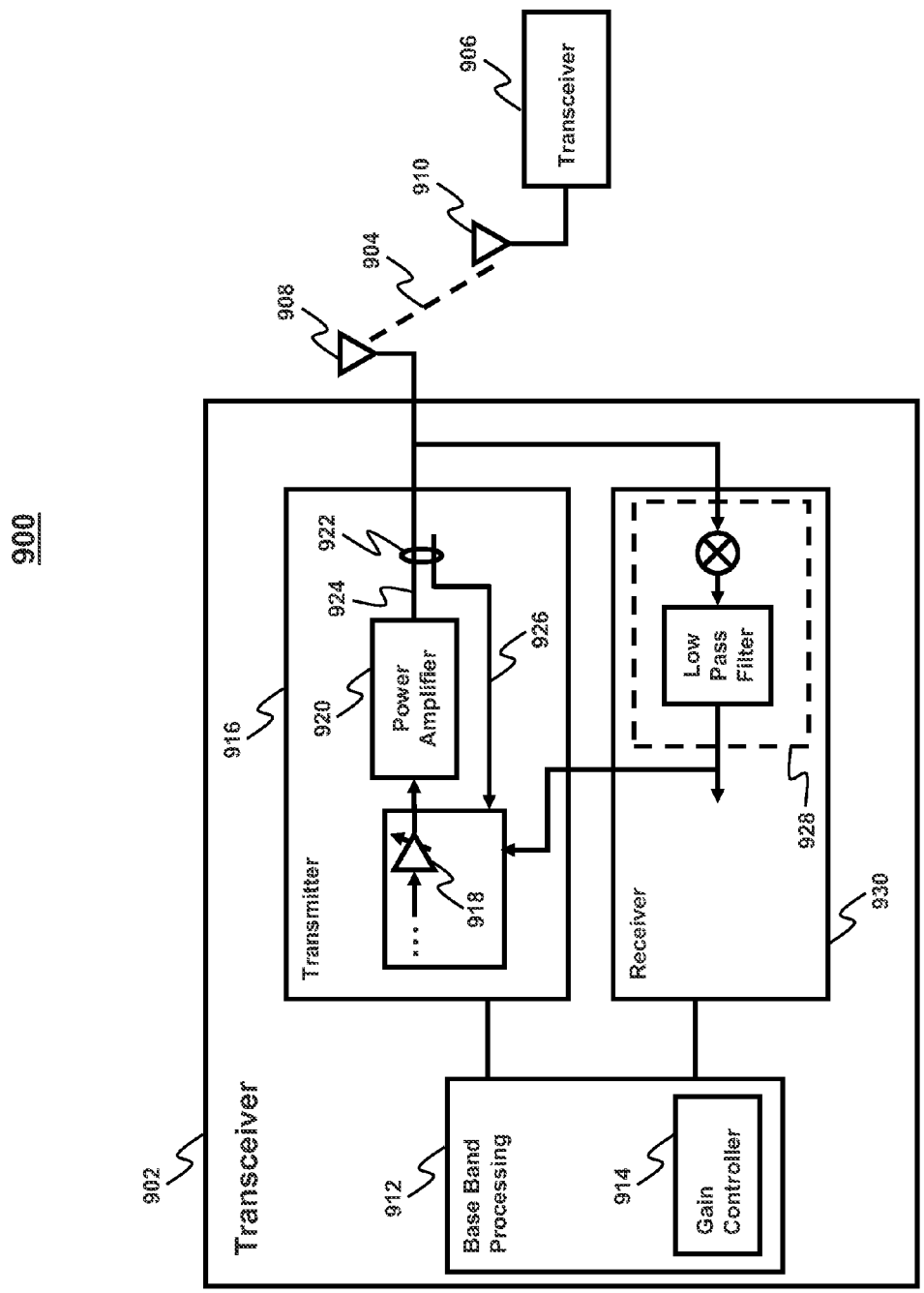
FIG. 9 is a simplified block diagram of one embodiment of a communication system constructed in accordance with the invention.

The teachings of the invention may be implemented in variety of systems. FIG. 9 illustrates one embodiment of a communication system 900 employing a transmitter as discussed herein. A transceiver 902 sends RF signals 904 to and receives RF signals 904 from another transceiver 906 via an antenna 908. The transceiver 906 likewise includes an antenna 910. For convenience, additional details are shown only for transceiver 902. In some embodiments the transceiver 902 may be in a wireless handset, while the transceiver 906 may be located in a base station.

The transceiver 902 includes baseband processing 912 that controls the communications between the transceivers. Such processing may include, for example, providing data to be transmitted, processing received data and performing protocol processing to support the wireless communication standard(s) supported by the transceivers. Typical wireless communication standards that may be employed include, for example, GMS, EDGE and PCS.

As discussed above, the baseband processing 912 may include a gain controller 914 that controls the power output of the transmitter. For example, the gain controller may generate the signal 562 discussed above to increase the gain of the amplitude modulation control loop or the power amplifier.

FIG. 9 illustrates an embodiment of a transmitter 916 that incorporates a mixer or a variable gain amplifier 918 and a power amplifier 920. As discussed above, in this case the power amplifier 920 may be a linear amplifier.

FIG. 9 also illustrates an embodiment where the power amplifier 920 is located on a different integrated circuit than the other components of the transmitter as described, for example, in FIG. 5. In this case, a coupler 922 may be used to couple the output signal 924 from the power amplifier 920 back to the other transmitter components as represented by line 926.

FIG. 9 also illustrates an embodiment where down conversion components (e.g., a mixer and a low pass filter) 928 in a receiver 930 in the transceiver 902 may provide the down-converted output signal for the transmitter. This, implementation may be used, in particular, in applications such as GSM where the transmitter does not transmit signals at the same time the receiver receives signals.

From the above, it should be appreciated that the teachings of the invention may be implemented in a variety of ways using various components and configurations. For example, a variety of circuits may be used to perform the operations discussed above such as envelope detection, envelope comparison, amplification, filtering error detection, generation of control signals. In addition, the amplitude modulated output signal may be generated by a variable gain amplifier, a mixer or other types of circuits in any embodiment including those described herein.

Different embodiments of the invention may include a variety of hardware and software processing components. In some embodiments of the invention, hardware components such as controllers, state machines and/or logic are used in a system constructed in accordance with the invention. In some embodiment of the invention, code such as software or firmware executing on one or more processing devices may be used to implement one or more of the described operations.

Such components may be implemented on one or more integrated circuits. For example, in some embodiments several of these components may be combined within a single integrated circuit. In some embodiments some of the components may be implemented as a single integrated circuit. In some embodiments some components may be implemented as several integrated circuits.

The components and functions described herein may be connected/coupled in many different ways. The manner in which this is done may depend, in part, on whether the components are separated from the other components. In some embodiments some of the connections represented by the lead lines in the drawings may be in an integrated circuit, on a circuit board and/or over a backplane to other circuit boards. In some embodiments some of the connections represented by the lead lines in the drawings may comprise a data network, for example, a local network and/or a wide area network (e.g., the Internet).

The signals discussed herein may take several forms. For example, in some embodiments a signal may be an electrical signal transmitted over a wire while other signals may consist of light pulses transmitted over an optical fiber. A signal may comprise more than one signal. For example, a differential signal comprises two complementary signals or some other combination of signals. In addition, a group of signals may be collectively referred to herein as a signal.

Signals as discussed herein also may take the form of data. For example, in some embodiments an application program may send a signal to another application program. Such a signal may be stored in a data memory.

The components and functions described herein may be connected/coupled directly or indirectly. Thus, in some embodiments there may or may not be intervening devices (e.g., buffers) between connected/coupled components.

In summary, the invention described herein generally relates to an improved transmitter. While certain exemplary embodiments have been described above in detail and shown in the accompanying drawings, it is to be understood that such embodiments are merely illustrative of and not restrictive of the broad invention. In particular, it should be recognized that the teachings of the invention apply to a wide variety of systems and processes. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. A communication system comprising:
a first modulator configured to receive I and Q signals and configured to generate an amplitude and phase modulate signal from the received I and Q signals;
circuitry configured to receive the amplitude and phase modulated signal from the first modulator and configured to provide a modulated input signal that comprises the amplitude and phase modulated signal with amplitude modulation removed, wherein the circuitry is communicatively disposed between the first modulator and a phase detector of a translational loop;
the translational loop coupled to receive the modulated input signal from the circuitry, the translational loop configured to generate a phase modulated signal in accordance with the modulated input signal and a phase feedback signal derived from the phase modulated signal, the phase modulated signal not including the amplitude modulation;
an amplitude modulator coupled to receive the phase modulated signal, configured to amplitude modulate the phased modulated signal and configured to generate an amplitude modulated output signal in accordance with an amplitude control signal, the amplitude modulator comprising a mixer, the mixer comprising commutating switches and transconductor devices, wherein the mixer is tuned to an RF frequency of the amplitude modulated output signal to attenuate harmonics related to a mixing operation of the mixer; and an amplitude modulation control loop configured to generate the amplitude control signal in accordance with the amplitude modulated output signal and the amplitude and phase modulated signal from the first modulator, wherein the translational loop, the amplitude modulator, and the amplitude modulation control loop are part of a polar wireless communication architecture, wherein the translational loop is configured to receive the phase modulated signal before the phase modulated signal has been amplitude modulated by the amplitude modulator, wherein the amplitude modulation control loop is configured to receive the amplitude modulated output signal that has been amplitude modulated by the amplitude modulator, wherein the phase modulated signal is provided to the commutating switches, and wherein the amplitude control signal is provided to the transconductor devices.

2. The system of claim 1 wherein the amplitude modulation control loop comprises at least one envelope detector configured to detect envelopes associated with the modulated input and output signals to generate the control signal.

3. The system of claim 2 wherein the amplitude modulation control loop comprises at least one arithmetic unit for subtracting the detected envelopes to generate the gain control signal.

4. The system of claim 1 wherein the amplitude modulation control loop comprises at least one amplifier configured to provide loop gain for the amplitude modulation control loop.

5. The system of claim 1 comprising at least one gain controller configured to adjust output power of the modulated output signal.

6. The system of claim 1 wherein the translational loop comprises a first downconverter for downconverting the phase modulated signal to generate the phase feedback signal.

7. The system of claim 6 comprising a second downconverter coupled to receive the amplitude modulated output signal to generate an amplitude feedback signal.

8. The system of claim 6 wherein the translational loop comprises:
an amplitude limiter configured to generate an amplitude limited signal from the modulated input signal;
a phase/frequency detector and charge pump coupled to receive the amplitude limited signal and the phase feedback signal to generate an error signal;
a low pass filter coupled to receive the error signal to generate a VCO control signal; and
a VCO coupled to receive the VCO control signal to generate the phase modulated signal.

9. The system of claim 8 comprising a second downconverter and a second low pass filter coupled to receive the amplitude modulated output signal to generate an amplitude feedback signal.

10. The system of claim 9 comprising a first envelope detector coupled to receive the amplitude feedback signal that has passed through the second downconverter and the second low pass filter and configured to detect an envelope associated with the amplitude modulated output signal.

11. The system of claim 10 comprising:
a second envelope detector coupled to receive the amplitude and phase modulated signal from the first modulator and configured to detect an envelope associated with the amplitude and phase modulated signal; and
a comparator configured to generate a preliminary control signal according to a first signal received from the first envelope detector and a second signal received from the second envelope detector.

12. The system of claim 11 comprising a low pass filter coupled to receive the preliminary control signal, the low pass filter being disposed between the amplitude modulator and the comparator.

13. The system of claim 12 comprising at least one amplifier configured to increase the loop gain of the amplitude modulation control loop.

14. The system of claim 13 comprising at least one gain controller configured to adjust gain of the amplitude feedback signal.

15. The system of claim 1 comprising a digital to analog converter configured to generate the modulated input signal from a first digital signal.

16. The system of claim 15 comprising an analog to digital converter configured to generate a digital feedback signal in accordance with the amplitude modulated output signal.

17. The system of claim 16 comprising a digital to analog converter configured to generate the control signal from a second digital signal.

18. The system of claim 1 wherein the amplitude modulator comprises a variable gain amplifier.

19. The system of claim 9 wherein the second downconverter and the second low pass filter are configured to receive outgoing RF signals that are to be transmitted on an antenna and are also configured to receive incoming RF signals that are received from the antenna.

20. A communication system comprising:
a first modulator configured to receive I and Q signals and configured to generate an amplitude and phase modulate signal from the received I and Q signals;
circuitry configured to receive the amplitude and phase modulated signal from the first modulator and configured to provide a modulated input signal that comprises the amplitude and phase modulated signal with amplitude modulation removed, wherein the circuitry is communicatively disposed between the first modulator and a phase detector of a translational loop;
the translational loop coupled to receive the modulated input signal from the circuitry and configured to generate a phase modulated signal using a phase lock loop and the modulated input signal;
a mixer coupled to receive the phase modulated signal and an amplitude control signal and configured to generate an amplitude modulated output signal using the amplitude control signal, the mixer comprising commutating switches and transconductor devices, wherein the mixer is tuned to an RF frequency of the amplitude modulated output signal to attenuate harmonics related to a mixing operation of the mixer; and
an amplitude modulation control loop configured to generate the amplitude control signal in accordance with the amplitude modulated output signal and the modulated input signal,
wherein the translational loop, the mixer, and the amplitude modulation control loop are part of a polar wireless communication architecture,
wherein the amplitude modulation control loop includes a first envelope detector configured to detect an envelope of the amplitude and phase modulated signal from the first modulator and a second envelope detector configured to detect the envelope of the amplitude modulated output signal after mixing by the mixer, wherein the translational loop and the amplitude modulation control loop are configured to receive the amplitude modulated output signal after mixing by the mixer, wherein the phase modulated signal is provided to the commutating switches, and wherein the amplitude control signal is provided to the transconductor devices.

21. The system of claim 20 wherein the translational loop is part of a transmitter that transmits outgoing wireless radio signals via an antenna, wherein the translational loop uses a low pass filter and a second mixer in a feedback loop of the phase lock loop, wherein the low pass filter and the second mixer are part of a receiver, and wherein the receiver receives incoming wireless radio signals via the antenna and passes the received incoming wireless radio signals through the low pass filter and the second mixer of the translational loop.

22. The system of claim 20 wherein the translational loop includes a first downconverter and the amplitude modulation control loop includes a second downconverter.

23. The system of claim 20 comprising a first downconverter coupled to receive the output signal to generate a downconverted output signal.

24. The system of claim 23 comprising an amplitude limiter configured to receive the downconverted output signal and configured to generate a phase feedback signal for the translational loop.

25. The system of claim 23 comprising a second downconverter coupled to receive the phase modulated signal to generate a phase feedback signal for the translational loop.

26. The system of claim 20 comprising at least one gain controller configured to adjust output power of the modulated output signal.

27. A communication system comprising:
a first modulator configured to receive I and Q signals and configured to generate a digital amplitude and phase modulated baseband signal from the received I and Q signals;
circuitry configured to receive the digital amplitude and phase modulated baseband signal from the modulator and configured to provide a modulated input signal that includes the digital amplitude and phase modulated baseband signal with amplitude modulation removed, wherein the circuitry is communicatively disposed between the first modulator and a first digital to analog converter, wherein the first digital to analog converter is communicatively disposed between the circuitry and a phase detector of a translational loop;
the first digital to analog converter coupled to receive the modulated input signal and configured to generate an analog modulated input signal;
the translational loop coupled to receive the analog modulated input signal and a phase feedback signal and configured to generate a phase modulated signal;
an amplitude modulator coupled to receive the phase modulated signal and an amplitude control signal and configured to generate an amplitude modulated output signal, the amplitude modulator comprising a mixer, the mixer comprising commutating switches and transconductor devices, wherein the mixer is tuned to an RF frequency of the amplitude modulated output signal to attenuate harmonics related to a mixing operation of the mixer; and an amplitude modulation control loop coupled to receive the modulated output signal and the digital modulated input signal and configured to generate the control signal, wherein the translational loop, the amplitude modulator, and the amplitude modulation control loop are part of a polar wireless communication architecture, wherein the translational loop is configured to receive the phase modulated signal before the phase modulated signal is amplitude modulated by the amplitude modulator, wherein the amplitude modulation control loop is configured to receive the amplitude modulated output signal that has been amplitude modulated by the amplitude modulator, wherein at least the first modulator, the circuitry, the first digital to analog converter, the translational loop and the amplitude modulator are part of a transmitter that transmits outgoing RF signals via an antenna, wherein a receiver receives incoming RF signals via the antenna, wherein the received incoming RF signals pass through a second mixer and a low pass filter before being further processed, wherein the second mixer and the low pass filter are also part of a feedback loop of the transmitter, wherein the feedback loop is part of the translational loop or the amplitude modulation control loop of the transmitter, wherein the phase modulated signal is provided to the commutating switches, and wherein the amplitude control signal is provided to the transconductor devices.

28. The system of claim 27 wherein the amplitude modulation control loop comprises at least one envelope detector configured to detect envelopes associated with the digital modulated input signal and the output signal to generate the control signal.

29. The system of claim 28 wherein the amplitude modulation control loop comprises at least one digital arithmetic unit for subtracting the detected envelopes to generate the control signal.

30. The system of claim 27 wherein the amplitude modulation control loop comprises at least one digital amplifier configured to provide loop gain for the amplitude modulation control loop.

31. The system of claim 27 wherein the amplitude modulation control loop comprises at least one digital gain controller configured to adjust output power of the amplitude modulated output signal.

32. The system of claim 27 comprising a first downconverter coupled to receive the amplitude modulated output signal to generate a downconverted signal.

33. The system of claim 32 wherein the translational loop comprises:
a phase/frequency detector and charge pump coupled to receive the analog modulated input signal and the phase feedback signal to generate an error signal;
a low pass filter coupled to receive the error signal to generate a VCO control signal; and
a VCO coupled to receive the VCO control signal to generate the phase modulated signal.

34. The system of claim 33 comprising an amplitude limiter coupled to receive the downconverted signal to generate the phase feedback signal for the phase/frequency detector and charge pump.

35. The system of claim 32 comprising an envelope detector coupled to receive the downconverted signal to detect an envelope associated with the amplitude modulated output signal.

36. The system of claim 35 comprising:
an envelope detector coupled to receive the digital modulated input signal to detect an envelope associated with the digital modulated input signal; and
a comparator configured to generate an initial control signal according to the detected envelopes.

37. The system of claim 36 comprising a digital low pass filter coupled to receive the initial control signal to generate the control signal.

38. The system of claim 37 comprising at least one digital amplifier configured to increase the loop gain of the amplitude modulation control loop.

39. The system of claim 38 comprising at least one gain controller configured to adjust gain of the downconverted signal.

40. The system of claim 39 comprising an amplitude limiter configured to amplitude limit the digital modulated input signal.

41. The system of claim 40 comprising an analog to digital converter configured to generate the downconverted signal from the output signal.

42. The system of claim 41 comprising a second digital to analog converter configured to generate the control signal from a digital signal.

43. The system of claim 32 comprising a second downconverter coupled to receive the phase modulated signal to generate the phase feedback signal.

44. The system of claim 43, comprising an envelope detector coupled to receive the downconverted signal to detect an envelope associated with the amplitude modulated output signal.

45. The system of claim 44 comprising:
an envelope detector coupled to receive the digital modulated input signal to detect an envelope associated with the digital modulated input signal; and
a comparator configured to generate an initial control signal according to the detected envelopes.

46. The system of claim 45 comprising a low pass filter coupled to receive the initial control signal to generate the control signal.

47. The system of claim 46 comprising at least one gain controller configured to adjust gain of the downconverted signal.

48. The system of claim 47 comprising an amplitude limiter configured to amplitude limit the digital modulated input signal wherein the first digital to analog converter converts the amplitude limited signal to an analog signal.

49. The system of claim 48 comprising an analog to digital converter configured to digitize the downconverted signal.

50. The system of claim 49 comprising a second digital to analog converter configured to generate the control signal from a digital signal.

51. A communication method comprising:
receiving, by a first modulator, I and Q signals;
generating, by the first modulator, an amplitude and phase modulated signal from the I and Q signals;
generating, by circuitry, a modulated input signal comprising removing amplitude modulation from the amplitude and phase modulated signal, wherein the circuitry is communicatively disposed between the first modulator and a phase detector of a translational loop;
providing, by the circuitry, the modulated input signal to the translational loop to generate a phase modulated signal using the modulated input signal and a phase lock loop;
downconverting and low pass filtering the phase modulated signal to generate a phase feedback signal for the translational loop;
amplitude modulating the phase modulated signal in accordance with an amplitude control signal to generate a modulated output signal, wherein the amplitude modulating of the phase modulated signal comprises providing the phase modulated signal to commutating switches of a mixer and providing the amplitude control signal to transconductor devices of the mixer, wherein the mixer is tuned to an RF frequency of the modulated output signal to attenuate harmonics related to a mixing operation of the mixer;
providing the phase modulated signal to the translational loop before the phase modulated signal has been amplitude modulated in accordance with the amplitude control signal;
providing, to an amplitude modulation control loop, the modulated output signal, wherein the translational loop, the mixer, and the amplitude modulation control loop are part of a polar wireless communication architecture;
downconverting the modulated output signal to generate an amplitude feedback signal;
generating the amplitude control signal in accordance with the amplitude feedback signal and the modulated input signal; and
transmitting the modulated output signal via a transmitter of a wireless device, wherein the downconverting of the phase modulated signal or the downconverting of the modulated output signal occurs in a receiver of the wireless device, wherein the transmitter transmits outgoing RF signals via an antenna, wherein the receiver receives incoming RF signals via the antenna, wherein the circuitry that downconverts the phase modulated signal or the modulated output signal also downconverts the received incoming RF signals.

52. The method of claim 51 comprising detecting envelopes of the modulated input signal and the amplitude feedback signal to generate the control signal.

53. The method of claim 52 comprising subtracting the detected envelopes to generate the control signal.

54. The method of claim 51 comprising adjusting gain of the amplitude feedback signal.

55. The method of claim 51 wherein the amplitude modulating comprises mixing the phase modulated and the control signal.

56. The method of claim 51 wherein the amplitude modulating comprises using a variable gain amplifier to amplify the phase modulated signal and adjusting the gain of the variable gain amplifier in accordance the control signal.

57. A communication method comprising:
receiving, by a first modulator, I and Q signals;
generating, by the first modulator, an amplitude and phase modulated digital baseband signal from the I and Q signals;
generating, by circuitry, a modulated digital input signal comprising removing amplitude modulation from the amplitude and phase modulated digital baseband signal, wherein the circuitry is communicatively disposed between the first modulator and a digital to analog converter, wherein the digital to analog converter is communicatively disposed between the circuitry and a phase detector of a translational loop;

receiving, by the digital to analog converter, the digital amplitude and phase modulated digital input signal;

converting, by the digital to analog converter, the digital modulated input signal to an analog input signal;

detecting, by the phase detector of the translational loop, at least one of phase error and frequency error between the analog input signal and a phase feedback signal to generate an error signal;

low pass filtering the error signal to generate a VCO control signal;

controlling a voltage controlled oscillator in accordance with the VCO control signal to generate a phase modulated signal;

amplitude modulating the phase modulated signal in accordance with an amplitude control signal to generate a modulated output signal, wherein the amplitude modulating of the phase modulated signal comprises providing the phase modulated signal to commutating switches of a mixer and providing the amplitude control signal to transconductor devices of the mixer, wherein the mixer is tuned to an RF frequency of the modulated output signal to attenuate harmonics related to a mixing operation of the mixer;

generating the control signal in accordance with the modulated output signal and the digital modulated input signal;

providing the modulated output signal to an amplitude modulation control loop and the translational loop after the modulated output signal has been amplitude modulated in accordance with the control signal, wherein the translational loop, the mixer, and the amplitude modulation control loop are part of a polar wireless communication architecture; and transmitting the modulated output signal via a transmitter of a wireless communication device, wherein the transmitter transmits outgoing RF signals via an antenna, wherein a receiver receives incoming RF signals via the antenna, wherein the circuitry that downconverts the modulated output signal in a feedback loop of the translational loop or the amplitude modulation control loop also downconverts the received incoming RF signals.

58. The method of claim 57 comprising downconverting the modulated output signal to generate a downconverted signal and converting the downconverted signal to a digital signal to generate a digital feedback signal.

59. The method of claim 58 comprising detecting envelopes of the digital modulated input signal and the digital feedback signal.

60. The method of claim 59 comprising subtracting the detected envelopes to generate a digital control signal.

61. The method of claim 60 comprising converting the digital control signal to an analog signal to generate the control signal.

62. The method of claim 58 comprising amplitude limiting the downconverted signal to generate the phase feedback signal.

63. The method of claim 58 comprising downconverting the phase modulated signal to generate the phase feedback signal.

64. The method of claim 57 comprising adjusting gain of the digital feedback signal.

65. The method of claim 57 wherein the amplitude modulating comprises mixing the phase modulated and the control signal.

66. The method of claim 57 wherein the amplitude modulating comprises using a variable gain amplifier to amplify the phase modulated signal and adjusting the gain of the variable gain amplifier in accordance the control signal.

* * * * *